United States Patent
Matthews et al.

(10) Patent No.: US 11,533,813 B1
(45) Date of Patent: Dec. 20, 2022

(54) TOUCHSCREEN DISPLAY PANEL GRIPPING MECHANISM AND BEZEL

(71) Applicant: Rockwell Collins, Inc., Cedar Rapids, IA (US)

(72) Inventors: Cheyenne Matthews, Marion, IA (US); Jason A Myren, Marion, IA (US); Michael P. Matessa, Ben Lomond, CA (US); Sunil Patel, Cedar Rapids, IA (US); Devin Elbert, Fairfax, IA (US); Richard Thomas Stone, Ames, IA (US); Colten Wayne Fales, Broken Bow, NE (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/382,032

(22) Filed: Jul. 21, 2021

(51) Int. Cl.
*H05K 5/02* (2006.01)
*H05K 5/00* (2006.01)

(52) U.S. Cl.
CPC .......... *H05K 5/0017* (2013.01); *H05K 5/023* (2013.01)

(58) Field of Classification Search
CPC ...... H05K 5/0017; H05K 5/023; B64D 43/00; G06F 1/1637; G06F 1/1626; G06F 3/041; G06F 1/1601; G06F 3/0393
See application file for complete search history.

(56) References Cited

U.S. PATENT DOCUMENTS

| | | | |
|---|---|---|---|
| 6,639,577 B2 | 10/2003 | Eberhard | |
| 6,900,795 B1 * | 5/2005 | Knight, III | G06F 3/041 |
| | | | 349/190 |
| 8,368,664 B2 | 2/2013 | Jordan et al. | |
| 9,348,446 B1 * | 5/2016 | Barber | G06F 1/1601 |
| 9,454,187 B2 | 9/2016 | Aurongzeb et al. | |
| 9,870,093 B2 * | 1/2018 | Gannon | B60K 35/00 |
| 10,025,406 B2 | 7/2018 | Thomas et al. | |
| 10,838,554 B2 * | 11/2020 | Smith | B60K 37/00 |
| 11,031,968 B1 * | 6/2021 | Miller | H04B 1/3877 |
| 2011/0240830 A1 * | 10/2011 | Alemozafar | F16M 13/00 |
| | | | 248/689 |
| 2012/0105335 A1 * | 5/2012 | Suddreth | G06F 3/0393 |
| | | | 345/173 |
| 2012/0127115 A1 * | 5/2012 | Gannon | B60K 35/00 |
| | | | 345/173 |
| 2012/0176689 A1 * | 7/2012 | Brown | G02B 3/08 |
| | | | 359/742 |
| 2013/0002109 A1 * | 1/2013 | Gloria | G06F 1/1656 |
| | | | 312/244 |

(Continued)

FOREIGN PATENT DOCUMENTS

| | | |
|---|---|---|
| CA | 2757793 C | 5/2018 |
| EP | 2450771 B1 | 5/2019 |
| GB | 2572976 A | 10/2019 |

*Primary Examiner* — Hung S. Bui
*Assistant Examiner* — Sagar Shrestha
(74) *Attorney, Agent, or Firm* — Suiter Swantz pc llo

(57) ABSTRACT

A bezel for overhead panels provides a grip or hand rest so the pilot is not required to maintain a hand at a specific overhead location in space to interactive with a touchscreen display device. Gripping mechanisms take the strain off the arm and allow for more precise inputs during turbulence. In a further aspect, the bezel includes features at known locations to tactilely identify the location. Such features may include indentations or protrusions.

16 Claims, 7 Drawing Sheets

(56) References Cited

U.S. PATENT DOCUMENTS

| | | | | |
|---|---|---|---|---|
| 2014/0204529 A1* | 7/2014 | White | .................. | H05K 5/0221 |
| | | | | 361/679.55 |
| 2014/0328020 A1* | 11/2014 | Galant | ................. | F16M 11/105 |
| | | | | 361/679.56 |
| 2015/0062787 A1* | 3/2015 | Wilson | .................. | H04M 1/185 |
| | | | | 361/679.01 |
| 2017/0075442 A1* | 3/2017 | Thomas | .................. | G06F 3/041 |
| 2018/0004477 A1* | 1/2018 | Jang | ...................... | G06F 3/1423 |
| 2019/0345748 A1* | 11/2019 | Liao | .................... | H04M 1/0247 |
| 2020/0125141 A1* | 4/2020 | Wun | ...................... | G06F 1/1658 |
| 2020/0305522 A1* | 10/2020 | Ruhland | ................. | G06F 3/014 |

* cited by examiner

TOUCHSCREEN DISPLAY PANEL GRIPPING MECHANISM AND BEZEL

BACKGROUND

Existing overhead panel designs are out of normal view and require pilots to raise their hands/arms into unnatural positions. Placing a pilot in a stress position is not conducive to performing fine motor functions. Existing display bezels are minimized and allow substantially no room for users to rest their hands or interact with it in any way. It would be advantageous to have a system that provided support and positive positional feedback to operate overhead panels.

SUMMARY

In one aspect, embodiments of the inventive concepts disclosed herein are directed to a bezel for overhead panels that provides a grip or hand rest so the pilot is not required to maintain a hand at a specific overhead location in space to interact with a touchscreen display device. Gripping mechanisms take the strain off the arm and allow for more precise inputs during turbulence.

In a further aspect, the bezel includes features at known locations to tactilely identify the location. Such features may include indentations or protrusions.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by reference to the accompanying figures in which.

DETAILED DESCRIPTION

Figure 1:
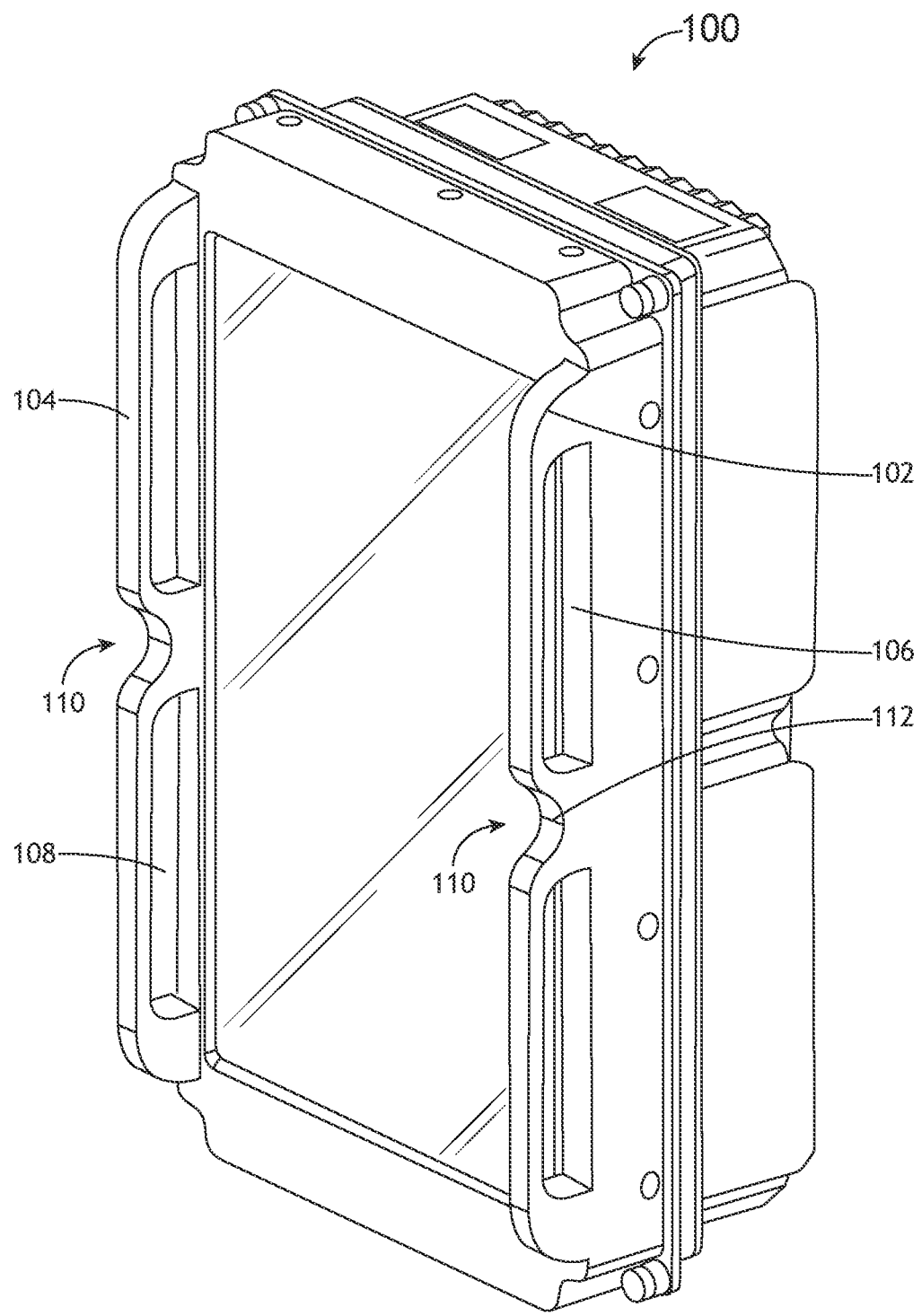
FIG. 1 shows a perspective view of a touchscreen bezel according to an exemplary side grip embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a bezel for overhead panels that provides a grip or hand rest so the pilot is not required to maintain a hand at a specific overhead location in space to interact with a touchscreen display device. Gripping mechanisms take the strain off the arm and allow for more precise inputs during turbulence. In a further aspect, the bezel includes features at known locations to tactilely identify the location. Such features may include indentations or protrusions.

Referring to FIG. 1, a perspective view of a touchscreen bezel 100 according to an exemplary embodiment is shown. The bezel 100 includes raised ridges 102, 104 that define gaps 106, 108 configured to allow users to rest their hands during breaks or while performing tasks. Elongated gaps 106, 108 allow users to slide their fingers along a side of the bezel. In at least one embodiment, a stabilizing connection element 112 may bisect the each raised ridge 102, 104.

Each raised ridge 102, 104 may define one or more finger locating features 110 disposed at specific locations so that the user may determine where their finger is with respect to the touchscreen by touch. In at least one embodiment, finger locating features 110 may comprise depressions in a corresponding raised ridge 102, 104, disposed at a stabilizing connection element 112.

Figure 2:
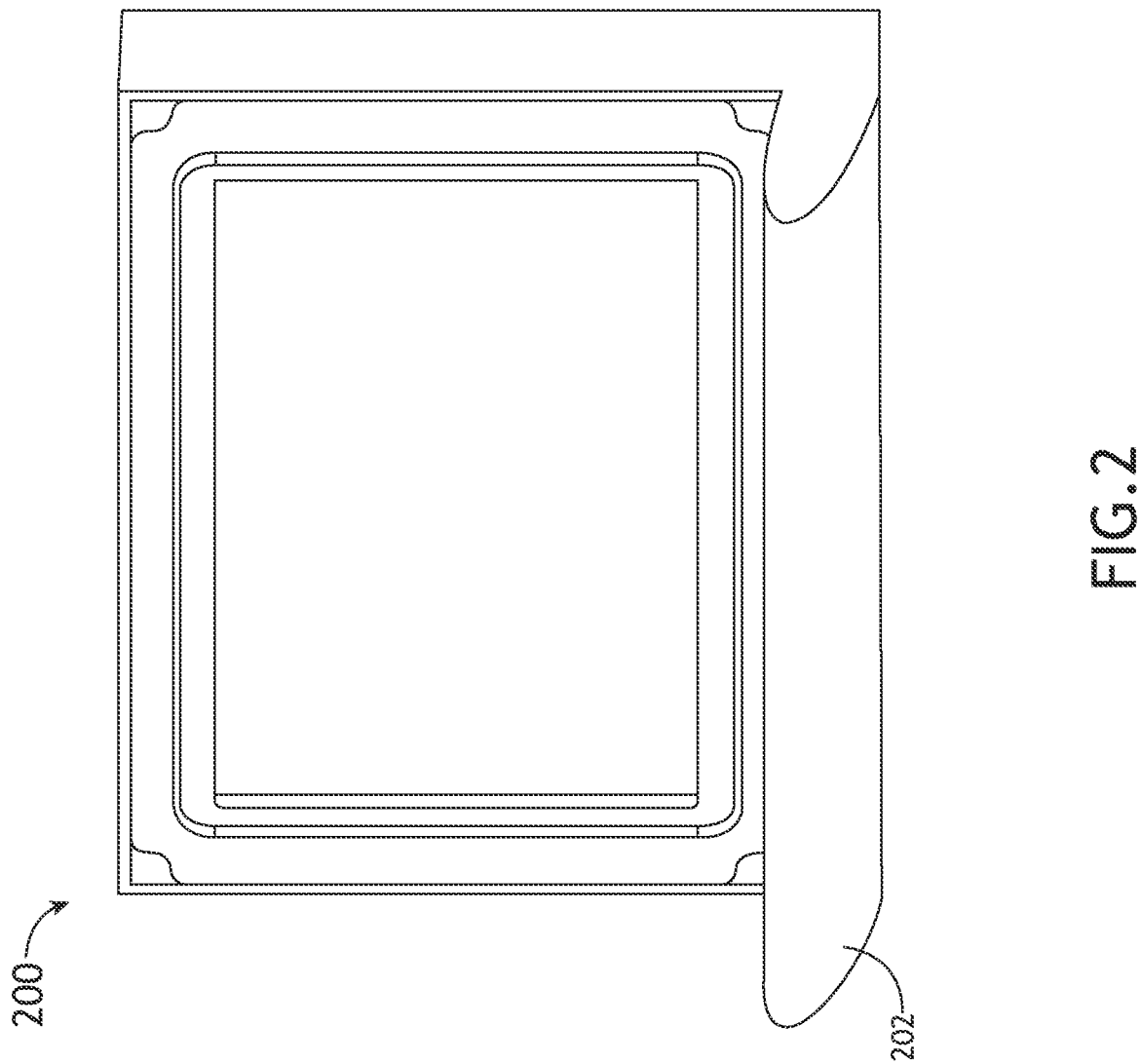
FIG. 2 shows a perspective view of a touchscreen bezel according to an exemplary bottom rest embodiment.

Referring to FIG. 2, a perspective view of a touchscreen bezel 200 according to an exemplary embodiment is shown. The bezel 200 includes a raised ridge or extruded side wall 202 along a single edge of the touchscreen display. The extruded side wall 202 extends sufficiently above the surface of the corresponding touchscreen to limit incidental contact when a user is resting or stabilizing their hand on the extruded side wall 202, but not so far as to obstruct the user's view of the touchscreen.

Figure 3:
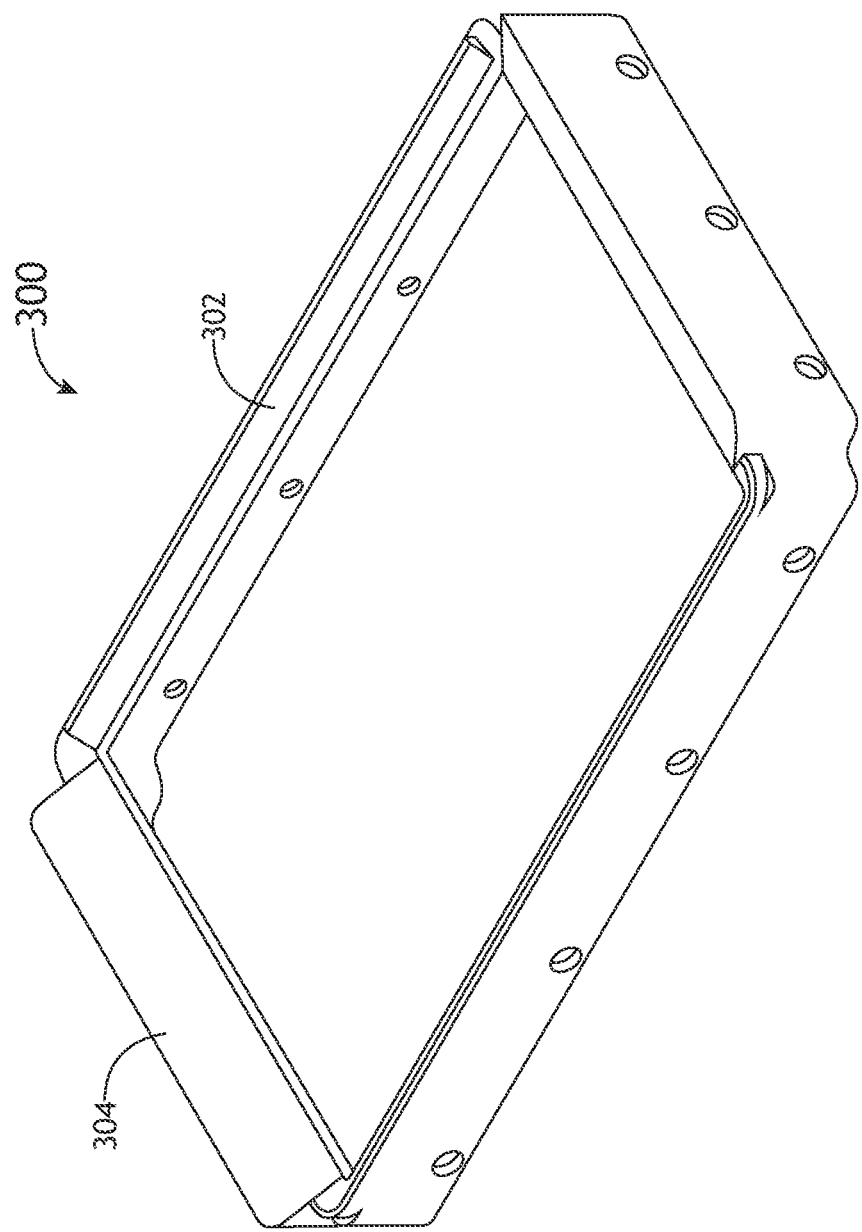
FIG. 3 shows a perspective view of a touchscreen bezel according to an exemplary raised bezel embodiment.

Referring to FIG. 3, a perspective view of a touchscreen bezel 300 according to an exemplary embodiment is shown. The "hook" portion of hook and loop fabric is disposed on side portions 304 of the bezel 300. The corresponding "loop" portion of the hook and look fabric is disposed on gloves worn by the user to rest and releasably secure the user's hand at a desired location with limited slippage. The "loop" portion may be disposed on one or more of the side, palm, or fingers of the user's gloves.

Figure 4A:
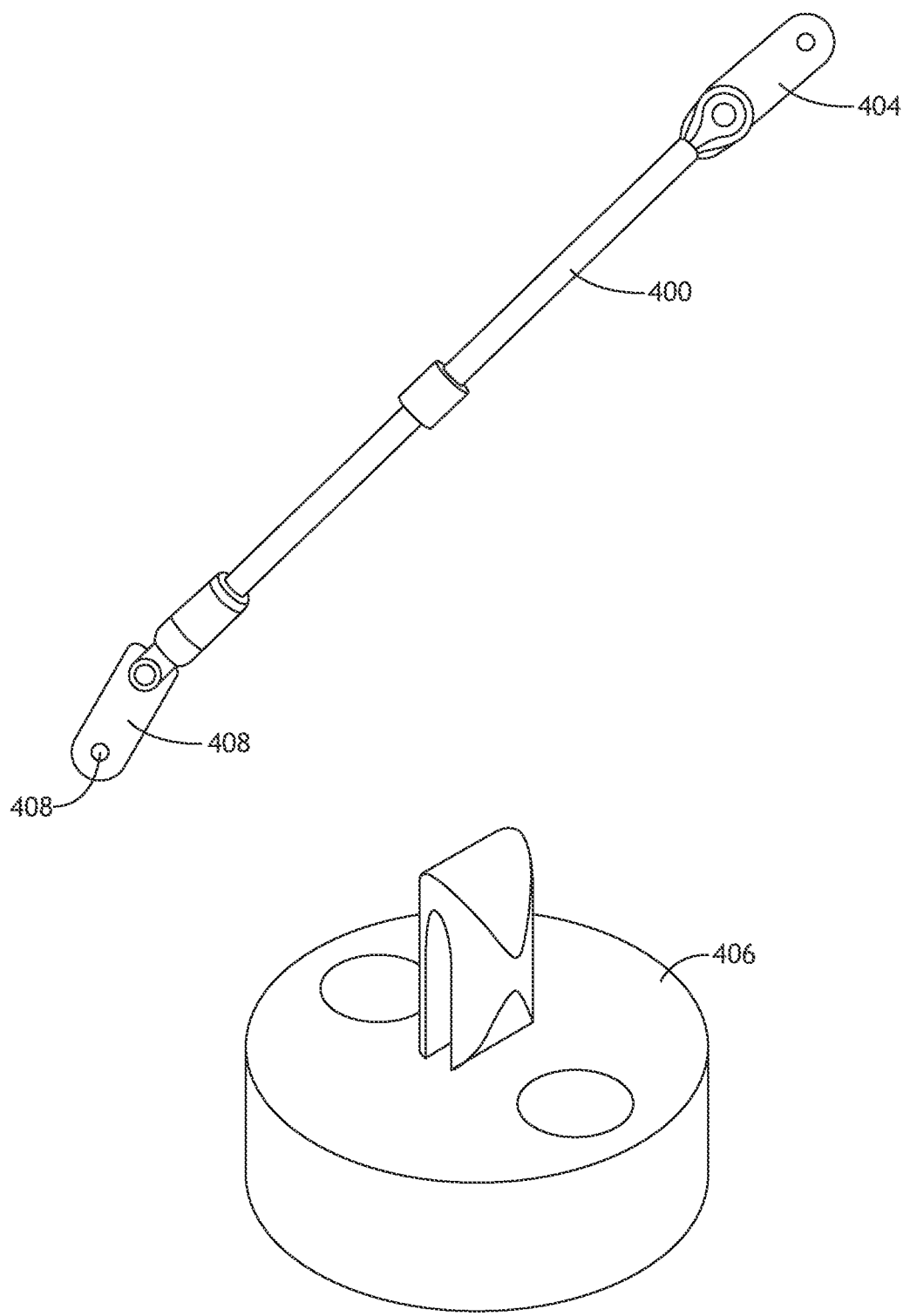
FIG. 4A shows a perspective view of a touchscreen bezel control bar according to an exemplary embodiment.
Figure 4B:
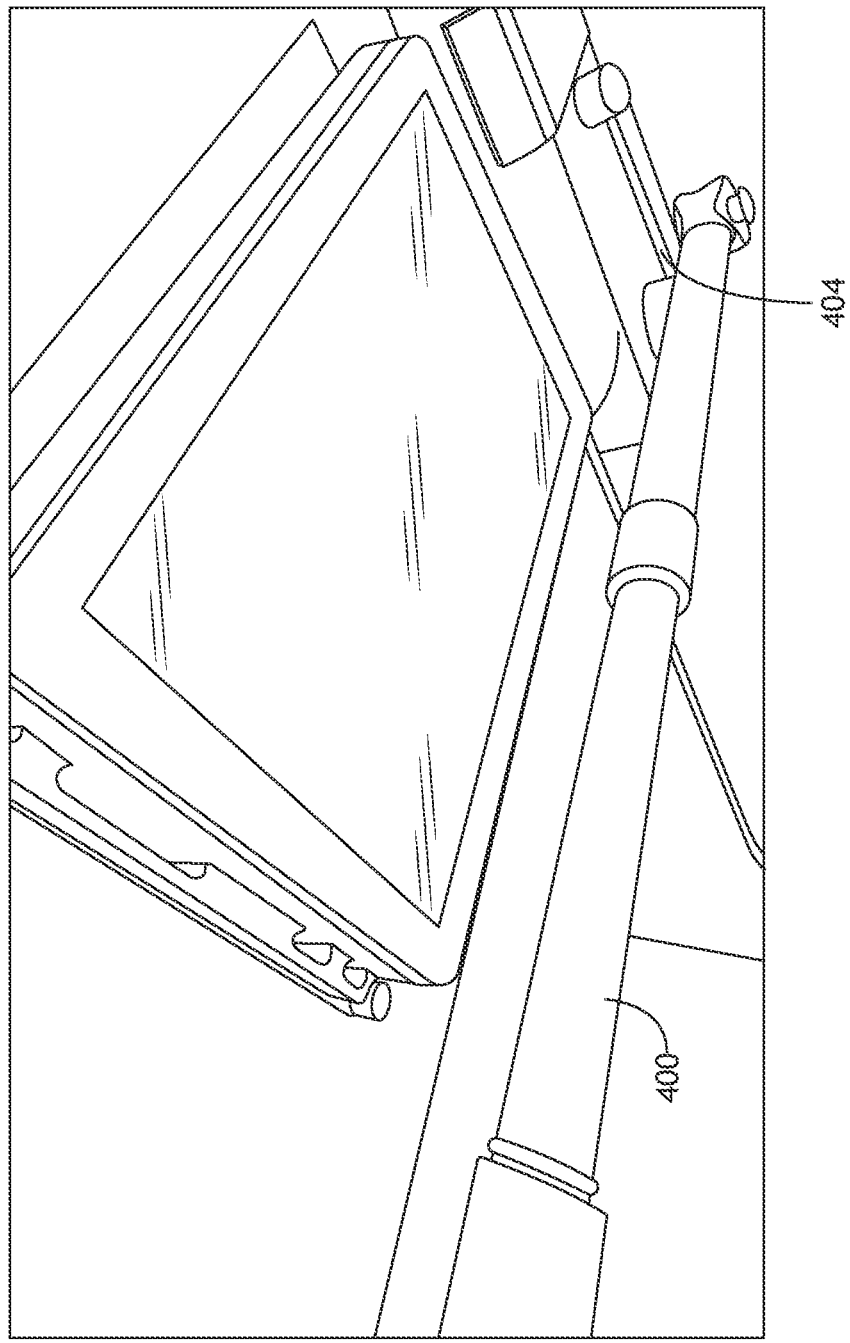
FIG. 4B shows an environmental view of a touchscreen bezel control bar according to an exemplary embodiment.

Referring to FIGS. 4A-4B, perspective and environmental views of a touchscreen bezel control bar according to an exemplary embodiment are shown. The bezel includes a plurality of contact points 406 disposed along the sides of the bezel. A repositionable rest bar 400 is attached to one of contact points 406. The repositionable bar 400 allows a user to slide their hand across the repositionable bar 400 while completing tasks to improve accuracy and reduce fatigue from maintaining a stress position.

In at least one embodiment, the repositionable bar 400 includes one or more articulable flanges 402, 404. The articulable flanges 402, 404 may define contact point engaging holes 408 that releasable engage the contact points 406.

Figure 5A:
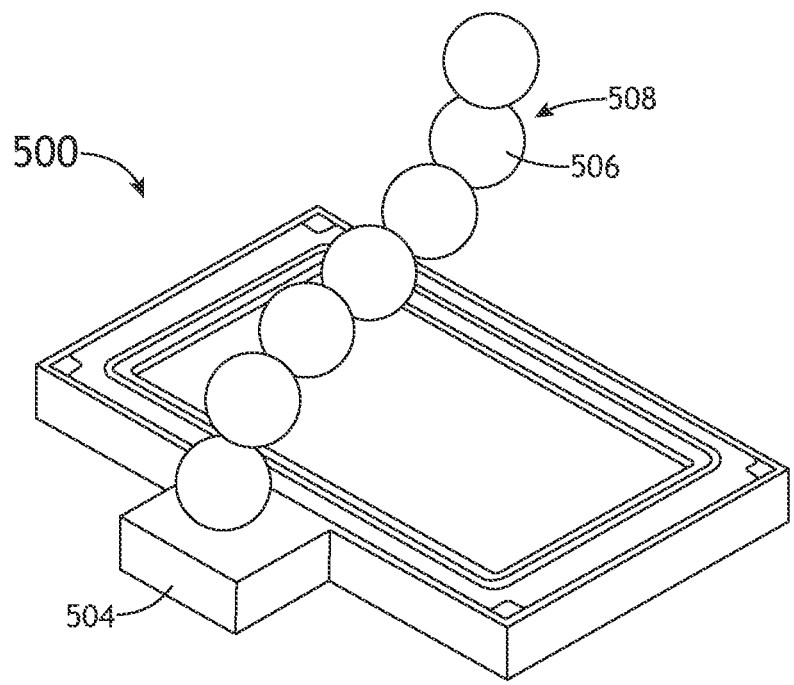
FIG. 5A shows a perspective view of a touchscreen bezel with gripping device according to an exemplary embodiment.
Figure 5B:
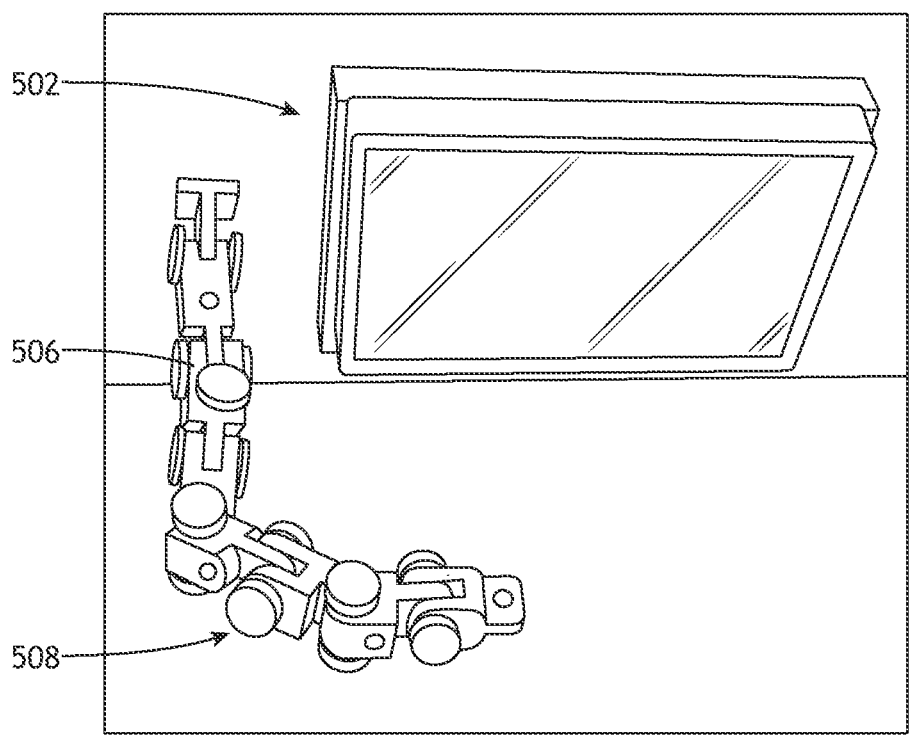
FIG. 5B shows an environmental view of a touchscreen bezel with gripping device according to an exemplary embodiment.

Referring to FIGS. 5A and 5B, a perspective view and an environmental view of a touchscreen bezel 500, 502 with gripping device according to an exemplary embodiment are shown. The bezel 500, 502 includes an articulation attach point 504 and a plurality of articulating elements 506 extending from the articulation attach point 504. The articulating elements 506 form an articulating handle 508 that may be bent into any desired position and orientation. The articulating handle 508 provides a structure for the user to grip during tasks to reduce fatigue from holding the user's arm in an overhead stress position.

In at least one embodiment, the plurality of articulating elements 506 each include a locking mechanism to lock the articulating handle 508 into position to provide support when pressing buttons.

Figure 6:
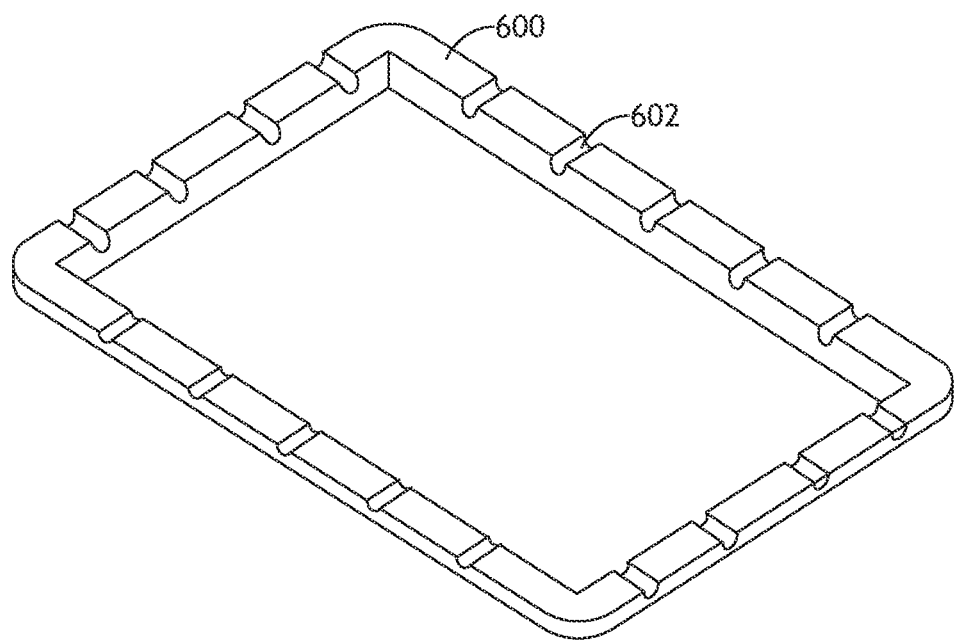
FIG. 6 shows a perspective view of a touchscreen bezel according to an exemplary embodiment.

Referring to FIG. 6, a perspective view of a touchscreen bezel 600 according to an exemplary embodiment is shown. The bezel 600 defines a plurality of finger locating features 602, either extending from or recessed into the bezel 600. In at least one embodiment, finger recesses are disposed periodically around the perimeter of the bezel 600. In at least one embodiment, the recesses may be color coded such that a user may quickly, visually verify the relative location of the user's hand.

Figure 7:
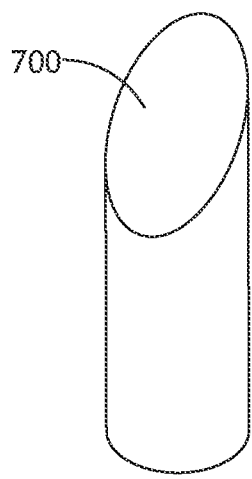
FIG. 7 shows a perspective view of a textured pin insert according to an exemplary embodiment.

Referring to FIG. 7, a perspective view of a textured pin insert 700 according to an exemplary embodiment is shown. A bezel may define a plurality of textured pin holes, each configured to receive a textured pin insert 700. In at least one embodiment, the textured pin inserts 700 are disposed periodically around the bezel to provide a tactile indication of location and allow the user to positively rest their hand at a known location, thereby reducing strain.

Bezels according to the present disclosure allow users to rest their hands and alleviate stress during breaks and stabilize their hands while performing tasks, especially during intense vibrational periods, to improve accuracy.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A display device comprising:
   a bezel having a surface area to provide a rest area for a user's hand; and
   one or more raised features extending a surface of the bezel away from a display surface of the display device to prevent incidental contact with the display surface by the user's hand,
   wherein:
   the one or more raised features define one or more gaps to admit a user's fingers; and
   each of the one or more raised features comprises a plurality of contact points and a repositionable bar releasably attached to two of the plurality of contact points, the repositionable bar comprising one or more articulable flanges defining engaging holes to releasable engage the contact points.

2. The display device of claim 1, wherein the one or more raised features each define a stabilizing feature configured to bisect one of the one or more gaps.

3. The display device of claim 2, wherein the one or more raised features define a finger locating recess disposed proximal to the stabilizing feature.

4. The display device of claim 1, wherein the one or more raised features comprise a singled raised shelf disposed on one lateral edge of the bezel.

5. The display device of claim 1, wherein the one or more raised features comprise a plurality of textured pin inserts disposed periodically around the bezel.

6. The display device of claim 5, wherein the textured pin inserts are color coded according to a location on the bezel.

7. A display bezel comprising:
   a surface area to provide a rest area for a user's hand; and
   one or more raised features extending a surface of the bezel away from a display surface of the display device to prevent incidental contact with the display surface by the user's hand,
   wherein:
   the one or more raised features define one or more gaps to admit a user's fingers; and
   each of the one or more raised features comprises a plurality of contact points and a repositionable bar releasably attached to two of the plurality of contact points, the repositionable bar comprising one or more articulable flanges defining engaging holes to releasable engage the contact points.

8. The display bezel of claim 7, wherein the one or more raised features each define a stabilizing feature configured to bisect one of the one or more gaps.

9. The display bezel of claim 8, wherein the one or more raised features define a finger locating recess disposed proximal to the stabilizing feature.

10. The display bezel of claim 7, wherein the one or more raised features comprise a hook portion of hook and loop fabric disposed on the rest area, and configured to engage a loop portion of hook and loop fabric on a user's gloves.

11. The display bezel of claim 10, wherein the hook portion is disposed on lateral sides of the bezel.

12. A system comprising:
a display device;
a bezel disposed around the display device having a surface area to provide a rest area for a user's hand, the bezel comprising one or more raised features extending a surface of the bezel away from a display surface of the display device to prevent incidental contact with the display surface by the user's hand, each of the one or more raised features comprising a plurality of contact points and a repositionable bar releasably attached to two of the plurality of contact points, the repositionable bar comprising one or more articulable flanges defining engaging holes to releasable engage the contact points; and
one or more gripping devices disposed proximal to the display device,
wherein the one or more gripping devices are configured to allow a user to stabilize the user's hand in an overhead orientation.

13. The system of claim 12, wherein each of the one or more gripping devices comprises a plurality of articulating elements.

14. The system of claim 13, wherein each of the plurality of articulating elements comprises a releasable locking element.

15. The system of claim 12, wherein the bezel defines a plurality of finger locating recesses disposed periodically around the bezel.

16. The system of claim 15, wherein the finger locating recesses are color coded according to a location on the bezel.

* * * * *